United States Patent
Park et al.

(10) Patent No.: US 8,762,904 B2
(45) Date of Patent: Jun. 24, 2014

(54) OPTIMIZING LOGIC SYNTHESIS FOR ENVIRONMENTAL INSENSITIVITY

(75) Inventors: Chaeryung Park, Saratoga, CA (US); Henry Sheng, San Mateo, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/432,935

(22) Filed: Mar. 28, 2012

(65) Prior Publication Data

US 2013/0263069 A1 Oct. 3, 2013

(51) Int. Cl.
*G06F 17/50* (2006.01)
*G06F 9/455* (2006.01)

(52) U.S. Cl.
USPC .......... 716/104; 716/101; 716/106; 716/108; 716/111; 716/113; 716/114; 716/132; 716/134; 703/14

(58) Field of Classification Search
USPC ......... 716/101, 104, 106, 108, 111, 113, 114, 716/132, 134; 703/14
See application file for complete search history.

(56) References Cited

U.S. PATENT DOCUMENTS

| | | | |
|---|---|---|---|
| 4,949,275 A | 8/1990 | Nonaka | |
| 5,274,568 A | 12/1993 | Blinne et al. | |
| 5,402,356 A * | 3/1995 | Schaefer et al. | 716/104 |
| 5,452,225 A | 9/1995 | Hammer | |
| 5,459,673 A | 10/1995 | Carmean et al. | |
| 5,467,291 A * | 11/1995 | Fan et al. | 703/14 |
| 5,590,050 A | 12/1996 | Okuda | |
| 5,619,420 A | 4/1997 | Breid | |
| 5,666,288 A | 9/1997 | Jones et al. | |
| 5,724,251 A | 3/1998 | Heavlin | |
| 5,737,236 A | 4/1998 | Maziasz et al. | |
| 5,745,373 A | 4/1998 | Watai et al. | |
| 5,764,525 A | 6/1998 | Mahmood et al. | |
| 5,838,579 A | 11/1998 | Olson et al. | |
| 5,903,468 A | 5/1999 | Misheloff et al. | |
| 5,903,476 A | 5/1999 | Mauskar et al. | |
| 5,930,148 A | 7/1999 | Bjorksten et al. | |
| 5,949,689 A | 9/1999 | Olson et al. | |
| 5,956,497 A | 9/1999 | Ratzel et al. | |
| 6,012,833 A | 1/2000 | Yoshikawa | |
| 6,047,247 A | 4/2000 | Iwanishi et al. | |
| 6,195,630 B1 | 2/2001 | Mauskar et al. | |
| 6,304,998 B1 | 10/2001 | Kamiya et al. | |
| 6,324,671 B1 | 11/2001 | Ratzel et al. | |
| 6,360,356 B1 * | 3/2002 | Eng | 716/105 |
| 6,374,203 B1 | 4/2002 | Millman et al. | |
| 6,385,761 B1 | 5/2002 | Breid | |
| 6,425,110 B1 * | 7/2002 | Hathaway et al. | 716/108 |
| 6,446,240 B1 | 9/2002 | Iyer et al. | |

(Continued)

*Primary Examiner* — Helen Rossoshek
(74) *Attorney, Agent, or Firm* — Haynes Beffel & Wolfeld LLP; Warren S. Wolfeld (57) ABSTRACT

Roughly described, a method for synthesizing a circuit design from a logic design includes developing candidate solutions for a particular signal path, a first candidate solution identifying a first library cells followed immediately downstream thereof by a first set of zero or more buffers, and a second candidate solution identifying a second library cell followed immediately downstream thereof by a second set of zero or more buffers, the first library cell and first set of buffers in combination being different from the second library cell and second set of buffers in combination. The computer system selects among the candidate solutions at least in part in dependence upon sensitivity of the solution to load capacitance in the particular path, and stores the selected solution in the storage for subsequent use in further developing and fabricating an integrated circuit device.

20 Claims, 8 Drawing Sheets

(56) References Cited

U.S. PATENT DOCUMENTS

| | | | | |
|---|---|---|---|---|
| 6,453,446 | B1 | 9/2002 | van Ginneken | |
| 6,467,068 | B1 | 10/2002 | Iyer et al. | |
| 6,470,484 | B1 | 10/2002 | Day et al. | |
| 6,480,815 | B1 | 11/2002 | Olson et al. | |
| 6,490,708 | B2 | 12/2002 | Cohn et al. | |
| 6,490,715 | B1 | 12/2002 | Moriwaki et al. | |
| 6,496,965 | B1 | 12/2002 | van Ginneken et al. | |
| 6,523,156 | B2 | 2/2003 | Cirit | |
| 6,532,576 | B1 | 3/2003 | Mbouombouo et al. | |
| 6,543,036 | B1 | 4/2003 | Iyer et al. | |
| 6,581,192 | B1 | 6/2003 | Krishnamoorthy | |
| 6,634,015 | B2 | 10/2003 | Lee et al. | |
| 6,643,832 | B1 | 11/2003 | Ray et al. | |
| 6,643,835 | B2 | 11/2003 | Matsumoto et al. | |
| 6,725,438 | B2 * | 4/2004 | van Ginneken | 716/113 |
| 6,745,373 | B2 | 6/2004 | Lackey | |
| 6,754,877 | B1 * | 6/2004 | Srinivasan | 716/114 |
| 6,766,499 | B1 | 7/2004 | Mbouombouo et al. | |
| 6,769,098 | B2 | 7/2004 | Tanaka et al. | |
| 6,789,232 | B1 | 9/2004 | Iyer et al. | |
| 6,865,723 | B2 | 3/2005 | Lackey | |
| 6,904,572 | B2 * | 6/2005 | Igarashi | 716/114 |
| 6,912,702 | B1 | 6/2005 | Iyer et al. | |
| 7,003,741 | B2 * | 2/2006 | Srinivasan | 716/113 |
| 7,043,709 | B2 * | 5/2006 | Levy | 716/113 |
| 7,055,121 | B1 | 5/2006 | Bolander et al. | |
| 7,107,551 | B1 | 9/2006 | de Dood et al. | |
| 7,143,367 | B2 * | 11/2006 | Eng | 716/102 |
| 7,146,591 | B2 | 12/2006 | Lyalin et al. | |
| 7,178,122 | B2 | 2/2007 | Kishibe | |
| 7,239,997 | B2 * | 7/2007 | Yonezawa | 703/19 |
| 7,245,516 | B2 | 7/2007 | Inoue | |
| 7,254,802 | B2 | 8/2007 | Zhang et al. | |
| 7,343,581 | B2 | 3/2008 | Becker | |
| 7,346,873 | B2 * | 3/2008 | Mandry | 716/114 |
| 7,352,165 | B2 * | 4/2008 | Loke et al. | 324/76.53 |
| 7,363,596 | B1 | 4/2008 | Park et al. | |
| 7,389,488 | B2 | 6/2008 | Chen et al. | |
| 7,426,710 | B2 | 9/2008 | Zhang et al. | |
| 7,441,218 | B2 | 10/2008 | Savithri et al. | |
| 7,448,009 | B2 | 11/2008 | Pundoor | |
| 7,448,011 | B2 | 11/2008 | Eshima | |
| 7,496,870 | B2 | 2/2009 | Lyalin et al. | |
| 7,530,047 | B2 | 5/2009 | Wang et al. | |
| 7,549,133 | B2 | 6/2009 | Lee et al. | |
| 7,559,043 | B2 | 7/2009 | Salgunan | |
| 7,579,606 | B2 | 8/2009 | Yoshida et al. | |
| 7,587,693 | B2 | 9/2009 | Ooshima | |
| 7,590,961 | B2 | 9/2009 | Gasper, Jr. et al. | |
| 7,594,202 | B2 | 9/2009 | de Dood et al. | |
| 7,653,885 | B2 | 1/2010 | Nandy et al. | |
| 7,716,612 | B1 | 5/2010 | Gupta et al. | |
| 7,784,013 | B2 | 8/2010 | Motiani et al. | |
| 7,800,409 | B2 | 9/2010 | Pitts | |
| 7,853,915 | B2 * | 12/2010 | Saxena et al. | 716/129 |
| 7,900,165 | B2 * | 3/2011 | Oh et al. | 716/136 |
| 7,917,885 | B2 | 3/2011 | Becker | |
| 7,921,397 | B2 | 4/2011 | Yamaguchi | |
| 7,921,400 | B1 | 4/2011 | Lien et al. | |
| 7,984,405 | B2 * | 7/2011 | Mang et al. | 716/110 |
| 8,024,680 | B2 | 9/2011 | Penzes | |
| 8,024,695 | B2 | 9/2011 | Reis et al. | |
| 8,042,071 | B2 | 10/2011 | Moyer et al. | |
| 8,046,728 | B2 | 10/2011 | Liu | |
| 8,079,008 | B2 | 12/2011 | Penzes et al. | |
| 8,112,737 | B2 | 2/2012 | Savithri et al. | |
| 8,117,575 | B2 | 2/2012 | Lu et al. | |
| 8,127,258 | B2 | 2/2012 | Abadir et al. | |
| 8,161,427 | B2 * | 4/2012 | Morgenshtein et al. | 716/55 |
| 8,180,621 | B2 * | 5/2012 | Phillips | 703/14 |
| 8,230,380 | B2 | 7/2012 | Penzes | |
| 8,234,605 | B2 | 7/2012 | Penzes | |
| 8,239,799 | B2 | 8/2012 | Riviere-Cazaux | |
| 8,266,561 | B2 | 9/2012 | Penzes | |
| 8,271,916 | B2 | 9/2012 | Motiani et al. | |
| 8,271,930 | B2 | 9/2012 | Reis et al. | |
| 8,281,276 | B2 * | 10/2012 | Nonaka | 716/134 |
| 8,359,558 | B2 * | 1/2013 | Tang et al. | 716/106 |
| 2003/0098731 | A1 * | 5/2003 | Tabatabaei et al. | 327/160 |
| 2005/0062496 | A1 * | 3/2005 | Gidon et al. | 326/40 |
| 2007/0050744 | A1 | 3/2007 | Lyalin et al. | |
| 2007/0148705 | A1 | 6/2007 | Lee et al. | |
| 2007/0157141 | A1 | 7/2007 | Salgunan | |
| 2007/0180415 | A1 | 8/2007 | Pundoor | |
| 2008/0098340 | A1 * | 4/2008 | Oh | 716/8 |
| 2008/0120588 | A1 | 5/2008 | Becker | |
| 2008/0148206 | A1 | 6/2008 | Yamaguchi | |
| 2009/0083691 | A1 | 3/2009 | Penzes | |
| 2009/0249259 | A1 | 10/2009 | Penzes et al. | |
| 2009/0249274 | A1 | 10/2009 | Liu | |
| 2010/0313176 | A1 | 12/2010 | Takahashi et al. | |
| 2012/0005639 | A1 * | 1/2012 | Fish et al. | 716/104 |
| 2012/0017192 | A1 | 1/2012 | Jou et al. | |
| 2012/0043583 | A1 * | 2/2012 | Abou-Khalil et al. | 257/157 |

* cited by examiner

| CELL FUNCTION | CELL ID | OPERATIONAL PARAMETERS | SENSITIVITY | ETC. |
|---|---|---|---|---|
| A | A1 | | | |
| | A2 | | | |
| | A3 | | | |
| | A4 | | | |
| B | B1 | | | |
| | B2 | | | |
| | B3 | | | |
| ..... | ..... | ..... | ..... | ..... |

OPTIMIZING LOGIC SYNTHESIS FOR ENVIRONMENTAL INSENSITIVITY

BACKGROUND

1. Field of the Invention

The invention relates to integrated circuit fabrication, and more particularly to logic synthesis techniques that have increased tolerance to build variations.

2. Description of Related Art

An integrated circuit design flow typically proceeds through the following stages: product idea, electronic design automation (EDA), tape-out, fabrication, packing/assembly, and chips. The EDA software stage typically includes steps of System Design, Logic Design and Functional Verification, Synthesis and Design for Test, Design Planning, Netlist Verification, Physical Implementation, Analysis and Extraction, Physical Verfication (DRC, LRC, LVS), Resolution Enhancement (OPC, PSM, Assists), and Mask Data Preparation.

Logic synthesis typically begins with a logic design which specifies the various functional blocks that are to be implemented on the integrated circuit, and a "netlist" that indicates the electrical interconnections that are to be made between outputs of each block and inputs of the next. The functional blocks are typically specified in terms of standard cell functions available in a library provided by a fabrication vendor, which are specific to the vendor's fabrication process technology. For most cell functions the library offers a number of different cells optimized for different purposes. It is primarily a task of logic synthesis to select the optimum cell from the library. The selection is usually made on the basis of factors such as minimum and maximum setup and hold times, chip area occupied, and leakage current, and it is an iterative process to select cells that optimize over an entire module or chip.

As chip designers begin preparing designs for the 28 and 20 nm technology nodes and below, however, circuit behavior is becoming increasingly unpredictable. Aspects of the invention address this problem.

SUMMARY

An opportunity therefore arises to create robust solutions to the problem of unpredictability in the physical implementation of logic designs. Better chip yields, and denser, and more powerful circuits, components and systems may result.

Roughly described, the invention involves a method for synthesizing a circuit design from a logic design which specifies functional blocks having inputs and outputs and signal paths, including developing candidate solutions for a particular signal path, a first candidate solution identifying, for implementing a particular one of the functional blocks in the path, a first library cells followed immediately downstream thereof by a first set of zero or more buffers, and a second candidate solution identifying, for implementing the particular functional block, a second library cell followed immediately downstream thereof by a second set of zero or more buffers, the first library cell and first set of buffers in combination being different from the second library cell and second set of buffers in combination. The computer system selects among the candidate solutions at least in part in dependence upon sensitivity of the solution to load capacitance in the particular path, and stores the selected solution in the storage for subsequent use in further developing and fabricating an integrated circuit device.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Overall Design Process Flow

Figure 1:
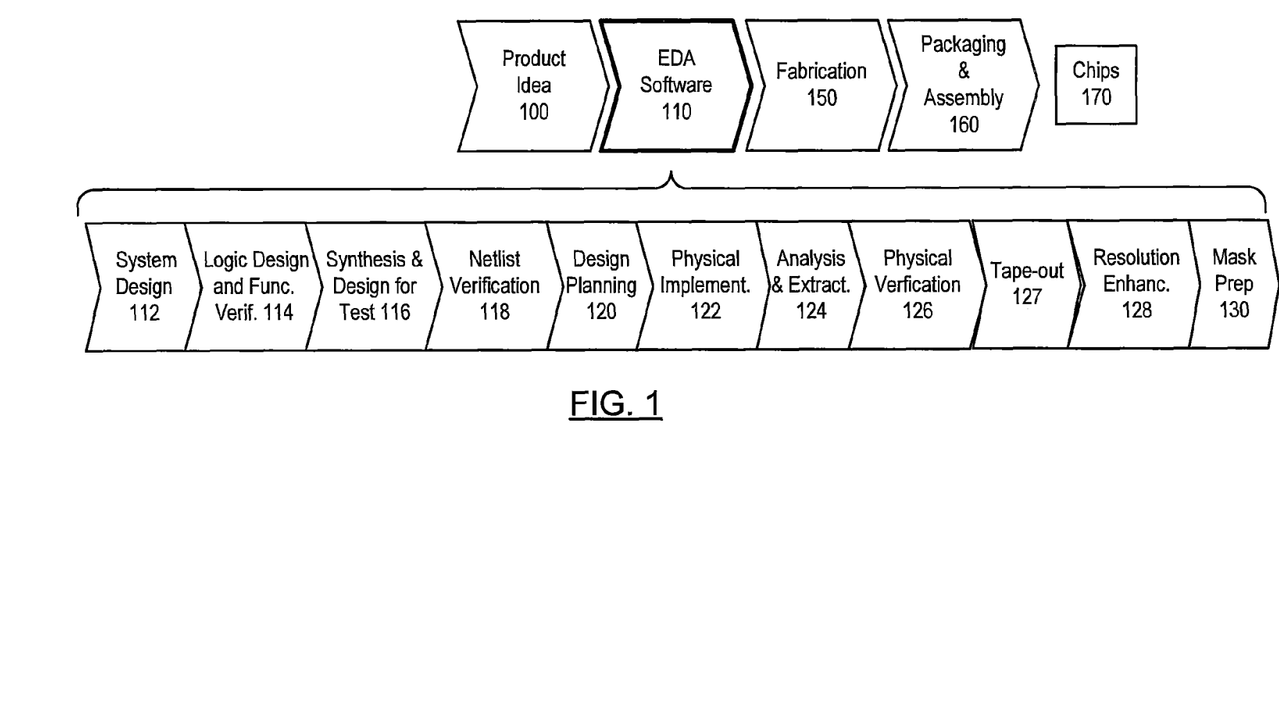
FIG. 1 is a simplified representation of an illustrative digital integrated circuit design flow.

FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 127). At some point after tape out, the fabrication process (step 150) and packaging and assembly processes (step 160) occur resulting, ultimately, in finished integrated circuit chips (result 170).

The EDA software design process (step 110) is itself composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products. This step can include selection of library cells to perform specified logic functions. Aspects of the invention can be performed during this step 116.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and Custom Designer products.

Physical implementation (step 122): The placement (positioning of circuit elements) and routing (connection of the same) occurs at this step, as can selection of library cells to perform specified logic functions. Example EDA software products from Synopsys, Inc. that can be used at this step include the Astro, IC Compiler, and Custom Designer products. Aspects of the invention can be performed during this step 122 as well.

Analysis and extraction (step 124): At this step, the circuit function is verified at a transistor level, this in turn permits what-if refinement. Example EDA software products from Synopsys, Inc. that can be used at this step include AstroRail, PrimeRail, PrimeTime, and Star-RCXT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape-out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides mask-making-ready "tape-out" data for production of masks for lithographic use to produce finished chips. Example EDA software products from Synopsys, Inc. that can be used at this step include the CATS(R) family of products.

Overview of the Technique

It is common for integrated circuit designers to take advantage of standard cells (also sometimes herein called macrocells) that have been pre-designed to perform particular functions, such as logic gates, registers, larger logic functions, memory and even entire processors or systems. These standard cells are provided in a library available from various sources, such as foundries, ASIC companies, semiconductor companies, third party IP providers, and even EDA companies, and used by designers when designing larger circuits. Each standard cell typically includes such information as a graphical symbol for schematic drawings; text for a hardware description language such as Verilog; a netlist describing the devices in the included circuit, the interconnections among them, and the input and output nodes; a layout (physical representation) of the circuit in one or more geometry description languages such as GDSII; an abstract of the included geometries for use by place-and-route systems; a design rule check deck; simulation models for use by logic simulators and circuit simulators; and so on. Some libraries may include less information for each cell, and others may include more. In some libraries the entries are provided in separate files, whereas in others they are combined into a single file, or one file containing the entries for multiple different cells. In all cases the files are either stored and distributed on a computer readable medium, or delivered electronically and stored by the user on a computer readable medium. A "computer readable medium", as the term is used herein, may include more than one physical item, such as more than one disk, or RAM segments or both. As used herein, the term does not include mere time varying signals in which the information is encoded in the way the signal varies over time.

Standard cells libraries often contain multiple versions of the same logic function differing in area, speed and/or power consumption, in order to allow designers or automated tools the option to trade off among these characteristics. A standard cell library can also be thought of as a database of standard cells. As used herein, the term "database" does not necessarily imply any unity of structure. For example, two or more separate databases, when considered together, still constitute a "database" as that term is used herein. As such, the entries defining each single standard cell can also be thought of as a "database".

As chip designs approach the 28 and 20 nm technology nodes and below, standard cell libraries are offering cells which are small (for reducing die area and cost) and which exhibit low leakage (for power reduction). Many of these cells have relatively weak output drive and, correspondingly, performance predictability challenges. At the same time, parasitic loads (resistance and capacitance that are driven by standard cells) are increasing in relative magnitude and are becoming significantly less predictable. As a result, circuit behavior is increasingly sensitive to even minute changes in the net resistance and capacitance, and these parasitic loads are themselves becoming less predictable. These uncertainties can result from environmental changes such as process, voltage and temperature (PVT) variations, placement/route changes, differences in analysis engines, or even in silicon as a matter of parametric variation. As a result, the frequency/performance and the design rule compliance of a chip can be severely impacted from these factors, which leads to predictability and convergence concerns. The quality of circuits may be in question because of the magnitude of the variation, and the brittleness of the quality-of-result (QoR) on an assumed environmental condition.

Embodiments of the invention address this unpredictability by selecting among the available cells at least in part in dependence upon their sensitivity to changes in output loading conditions. For example, under large loading conditions, cell transition time is already in the saturated region and perturbations in load capacitance will not significantly impact cell delay. But if load capacitance is in the mid-range of cell transition time, capacitive perturbation can introduce significant delay in transition time. Embodiments of the invention perform cell selection in dependence not only upon nominal delay, but also upon sensitivity of the cell to parasitic variation.

Figure 2:
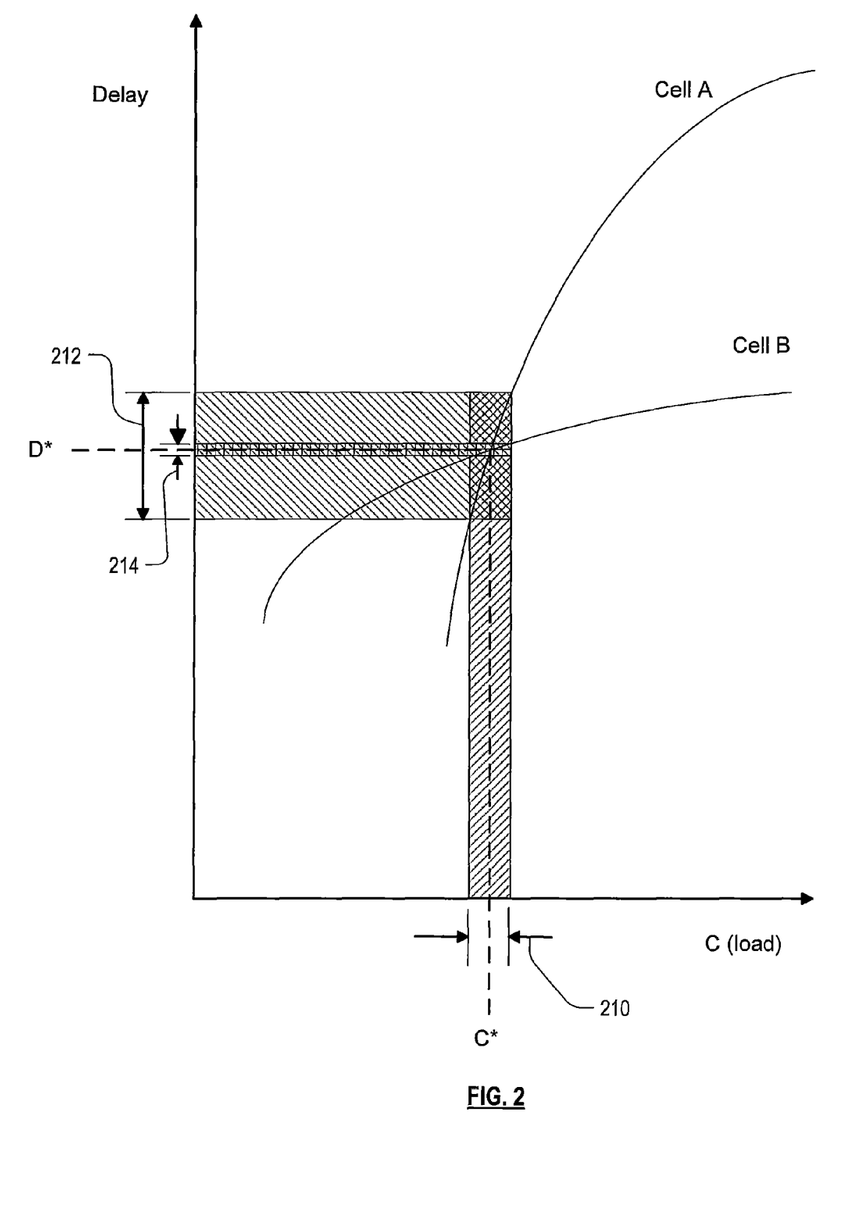
FIG. 2 is a plot of the sensitivity of the delay in two example cells.

FIG. 2 is a plot of the sensitivity of the delay in two example cells, Cell A and Cell B, to changes in load capacitance. Both cells are presumed to implement the same functional block, for example an and-or-invert gate. A typical cell selection problem might be as follows: for a given load C*, meet a delay requirement (e.g. setup, hold or transition) of D*. Find the cell which gives best delay for the given load. It can be seen from FIG. 2 that both cells will satisfy the requirement, and neither gives better delay than the other at the specified load C*. However, it can also be seen from the plots that should the actual load capacitance be off by a small amount 210 from the designed value C*, if Cell A had been chosen, then the actual cell delay may be off by a large amount 212. On the other hand, if Cell B had been chosen, then the actual cell delay error 214 is far smaller. This is because Cell A is much more sensitive to variations in load capacitance than is Cell B.

Figure 3:
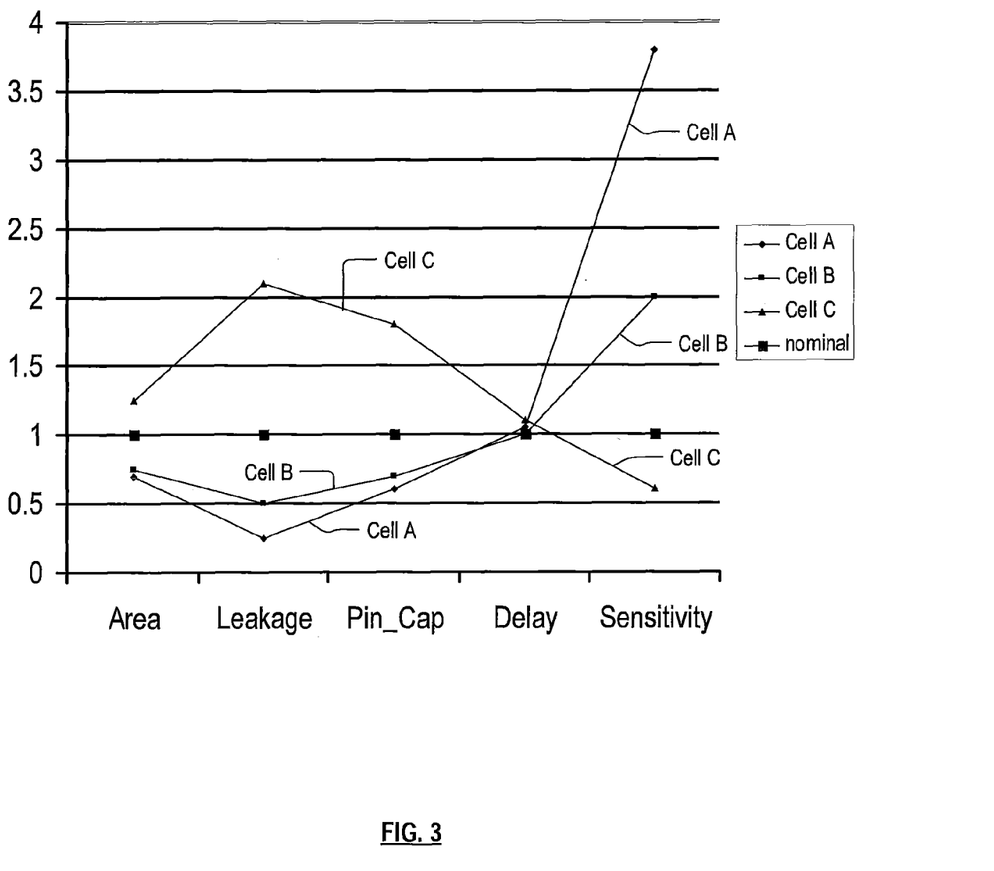
FIG. 3 is a plot of relative metrics for three example cells.

FIG. 3 illustrates a similar point when several factors in addition to delay are considered in cell selection. FIG. 3 plots relative metrics for area, leakage, pin_cap, delay and sensitivity for three cells, Cell A, Cell B and Cell C. All have substantially the same delay values. Cells A and B occupy approximately the same area, but Cell A has lower leakage than Cell B. Cell A also has slightly lower pin capacitance than Cell B. Overall, a conventional cost-based cell selection system would probably choose cell A. But this may be the wrong choice, given that Cell A is far more sensitive to environmental variations than Cell B.

Embodiments of the present invention can take sensitivity into account in the selection among cells provided by a standard cell library for implementing a particular functional block.

For complex cells, the cell selection candidate pool tends to be small and have a high degree of sensitivity. Conventional optimization techniques employ regular buffering techniques to reduce the delay for those complex cells. This is prone to finding an optimal solution with respect to the delay characteristics at a particular operating point, but which can potentially degrade severely if the actual operating point differs from the assumed operating point. In this situation, where the cell selection candidate pool is small, embodiments of the invention can add a buffer based on the assumed output load. The buffer is selected not only to have better delay but also to reduce the sensitivity. Preferably the buffers are placed physically adjacent to complex cell outputs to preserve a minimum variability in the load capacitance and resistance experienced by the cell output itself.

Sensitivity Database Preparation

Figure 4:
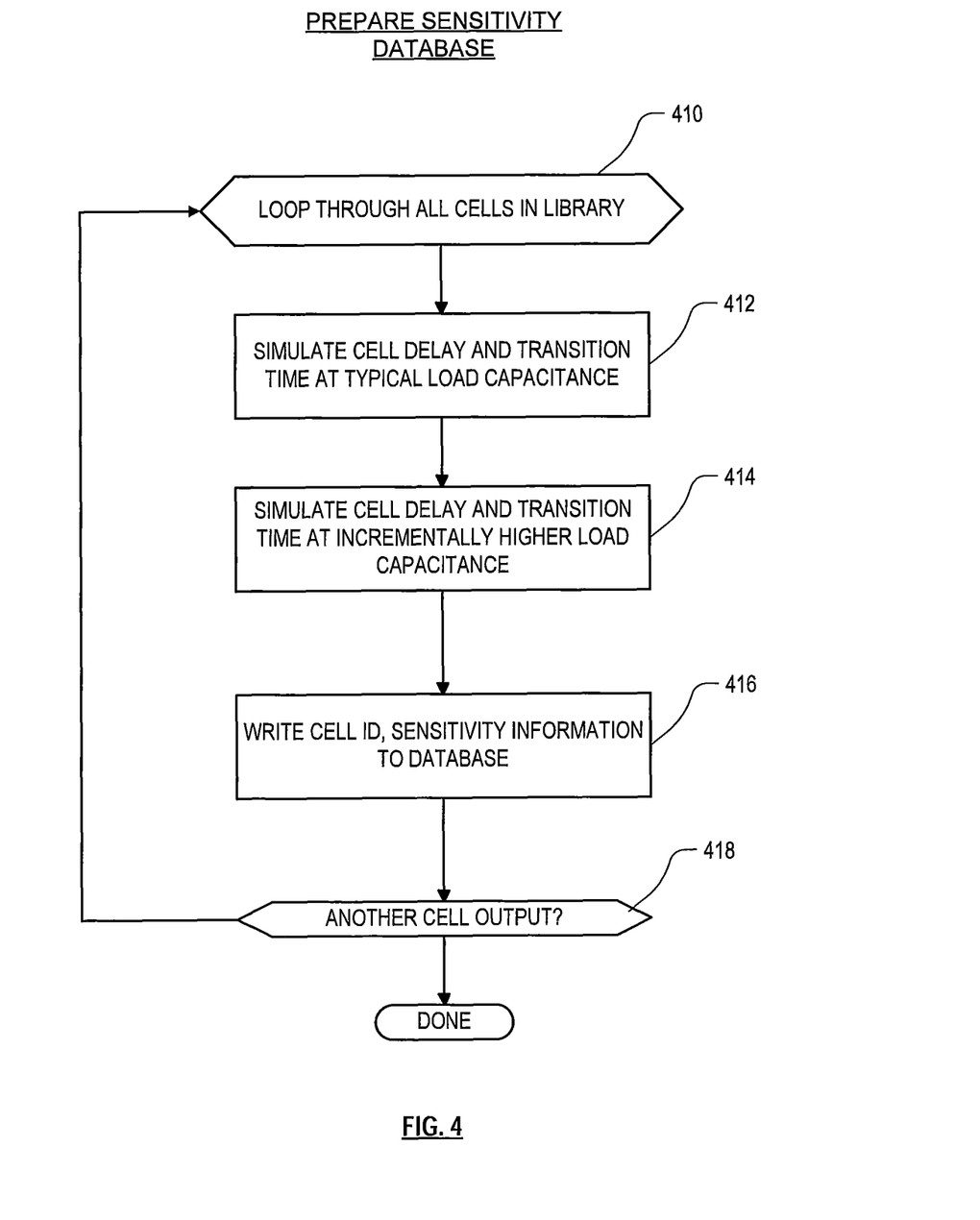
FIGS. 4 and 7 are flow charts illustrating processes including aspects of the invention.

In order to provide the sensitivity information for use in the above cell selection methods, it is another aspect of the invention to analyze the sensitivity behaviors of each library cell in advance. Library cells are characterized (e.g. sensitivity metric, cell delay, area and leakage), and buffers are analyzed to identify the best buffer per sensitivity metric. The resulting information can be provided in a separate database, or as part of the library itself FIG. 4 is a flow chart illustrating steps that are performed by a computer system in one embodiment to develop cell and buffer sensitivity information. As with all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

In step 410, the system begins a loop through all the cells in the library. This includes both sequential and combinatorial cells, as well as all the buffers in the library that might be inserted later at the output of a cell.

In step 412, if not already provided in the library, the system performs a simulation to approximate the cell delay and transition time at a typical operating point (load capacitance). In some libraries the typical operating point is set forth explicitly, whereas in others, it can be inferred or taken by default. Cell libraries often indicate a preferred range of operating conditions at which the cell should work best, and the typical operating point can be taken as the midpoint of the indicated range. In one embodiment, a library provides a table indicating the cell transition time at each of a number of different loading conditions; in such a case the typical operating point can be taken as the median of all the loading conditions in the table. Other ways of determining a typical operating point will be apparent to the reader.

In step 414, the system performs another simulation to approximate the cell delay and transition time at an incrementally different operating point. The incrementally different operating point may be, for example, a load of one fF higher or lower than the typical operating point. In some embodiments, simulations can be performed at more than operating point nearby the typical operating point, to thereby develop a more precise picture of how the cell timing characteristics change with loading conditions. In the embodiment of FIG. 4, however, only one such simulation is performed. Since it is only the relative sensitivity that is referenced in the subsequent cell selection steps, and relative sensitivity is not likely to be predicted with significantly greater accuracy by simulating at more than one operating point, a single simulation at one off-typical operating point is believed to be sufficient for present purposes.

In step 416, the cell sensitivity information developed in step 414 is written into a cell sensitivity database and stored on a computer readable medium. In one embodiment the cell sensitivity database is stored separately from the original library, and in this case each entry can indicate such information as a cell ID identifying the particular cell which the entry describes, the typical operating point selected, the cell delay and transition time at the typical operating point, and the cell sensitivity determined in step 414 (change in delay and transition time from the incremental change in load). In another embodiment the cell sensitivity information is integrated with the original library and stored with the library on the computer readable medium. In this case only the change in delay and/or transition time from the incremental change in load, as determined in step 414, need be added to the library database.

In step 418 the system determines whether there are more cells to analyze, and if so, then the system returns to step 410 to analyze the next cell. Whereas the embodiment of FIG. 4 analyzes all cells in the library, each at a single operating point which is considered typical for that cell, it will be appreciated that another embodiment could determine sensitivity data for some or all the cells at more than one operating point. In another embodiment, not all the cells in the library need necessarily be analyzed.

Cell Selection

Figure 5:
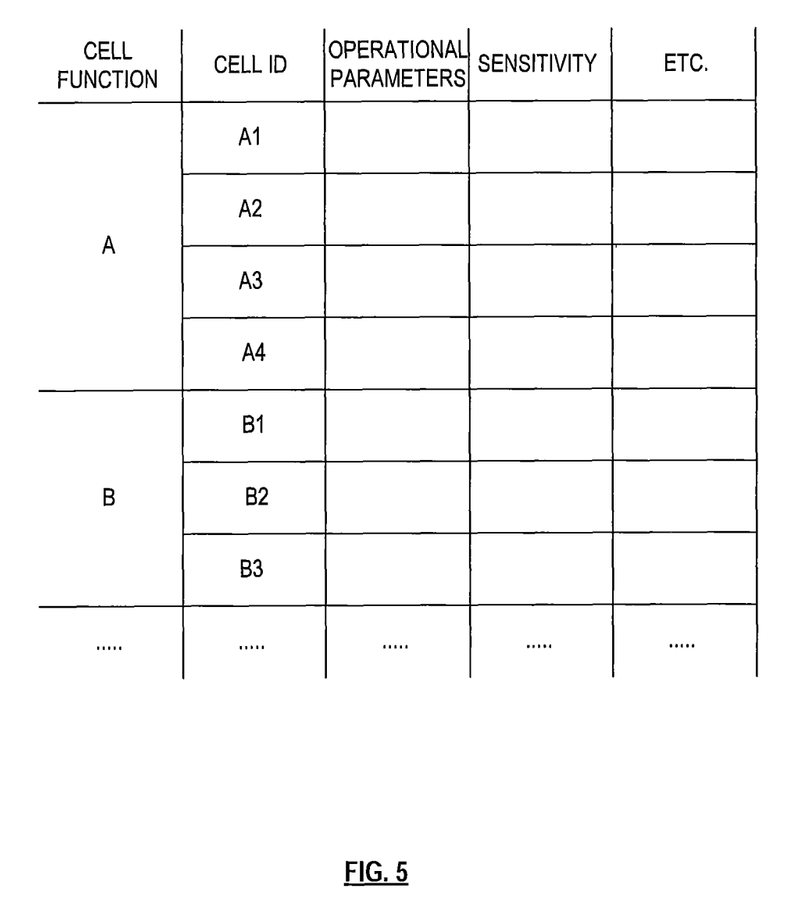
FIG. 5 illustrates an organization of a standard cell library database that includes aspects of the invention.

As mentioned, part of the usual integrated circuit design flow involves developing a logic design and then synthesizing a circuit design from a logic design. The logic design expresses the design with reference to the various functional blocks that are available as standard cells in the library, but for most functional blocks, the library typically includes more than one standard cell that can perform the particular function. FIG. 5 illustrates a typical organization for a standard cell library database that includes sensitivity information such as that resulting from FIG. 4. It can be seen that in this library, cell function A (also called functional block A) has four individual standard cells A1, A2, A3 and A4, all of which will perform the function A. These cells have various operational parameters such as cell delay, sample and hold times, transition time, capacitance, fan-out, cell area, leakage current, and sensitivity. Cell sensitivity can be represented in any of a variety of forms in various embodiments. In one embodiment it is represented as the change in delay and/or transition time, in units of time, from the incremental change in load, as determined in step 414. In another embodiment it is represented as some arithmetic function of such change in delay and/or transition time. The availability of multiple cell choices provides the designer (or design software) the ability to trade off some parameters in favor of others, in order to best satisfy the needs of the design. For example, a fast cell typically his higher leakage current (consumes more power), whereas a low power cell is typically slower. Similarly, cell function B in FIG. 5 has three standard cells B1, B2 and B3.

Figure 6:
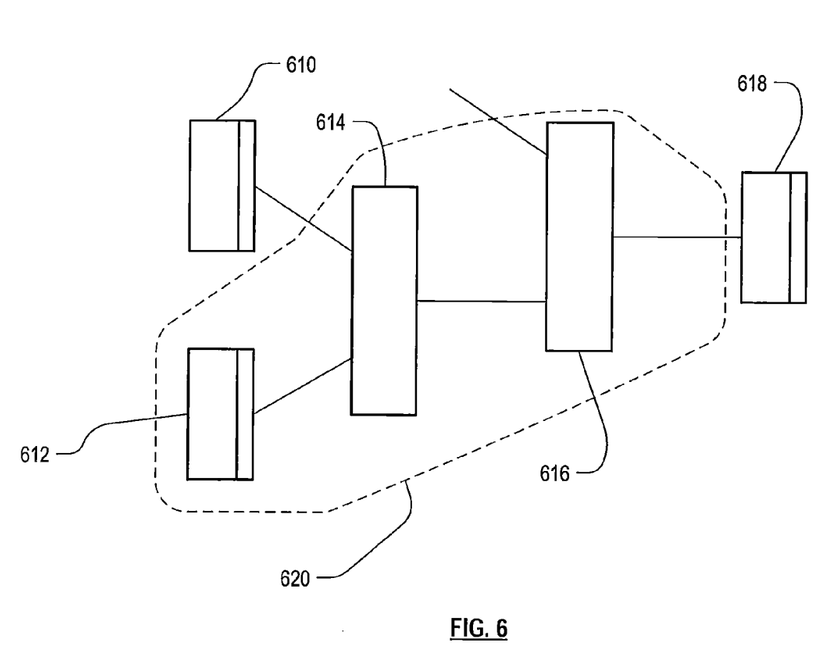
FIG. 6 is a functional block diagram of several functional blocks in a logic design.

Part of the process of synthesizing a circuit design from a logic design involves choosing which of the available standard cells are to be implemented for each of the functional blocks in the logic design. In one embodiment the functional blocks are considered one at a time, and cells are chosen to optimize for the needs of that particular functional block. More commonly, however, all the blocks in a given signal path, from a "source" sequential function, through any combinatorial functions to the input of a "destination" block input, are optimized together as a unit. To illustrate this, FIG. 6 is a functional block diagram of several functional blocks. In particular, FIG. 6 illustrates an excerpt from a logic design that includes two registers 610 and 612, the outputs of which are connected to respective inputs of an AND gate 614. The output of AND gate 614 is connected to one input of an OR gate 616, the other input of which is connected to the output of another block not shown. The output of OR gate 616 is connected to the input of another register 618.

As used herein, a signal "path" includes one or more functional blocks. It begins at a "source" functional block, passes through zero or more "signal path" functional blocks downstream of the source functional block, and ends at a "destination" functional block. As used herein, the "path" includes the source functional block but does not include the destination functional block. In embodiments discussed herein the source and destination functional blocks are all sequential functions, and the signal path functional blocks are all combinatorial functions; however that is not a requirement in all embodiments. In FIG. 6, one signal path 620 is outlined, and as can be seen it includes register 612 (which is the source functional block in path 620), AND gate 614, OR gate 616 and the interconnects that carry signals from one to the next, including the interconnect that carries the signal to the input of the next downstream functional block, register 618. Register 618 is the destination functional block of path 620 but is not considered part of the signal path itself. Register 610, though its output influences some of the signal values in the path 620, is also not part of the path itself.

Figure 7:
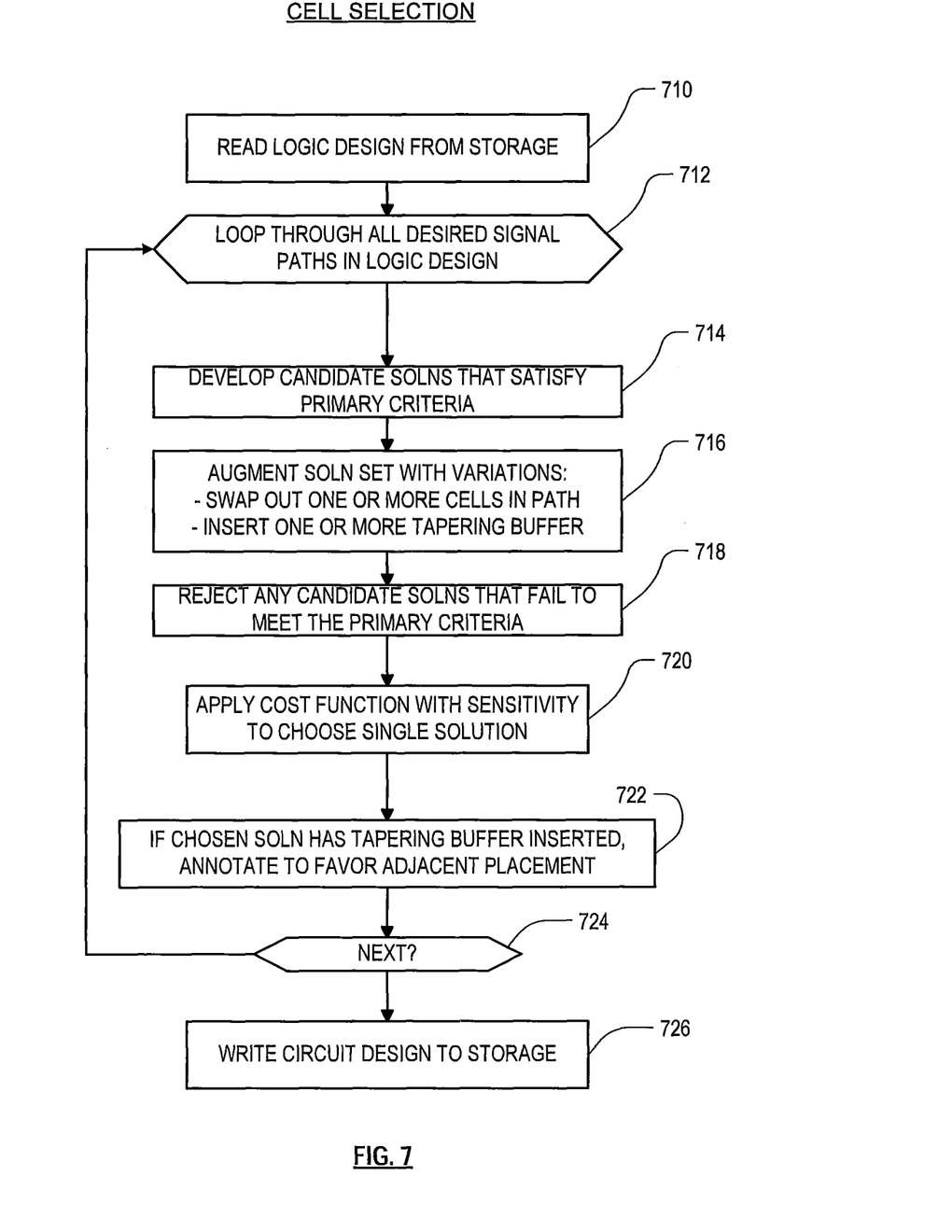

FIG. 7 is a flow chart illustrating steps that are performed by a computer system in one embodiment to perform the cell selection aspect of a process of synthesizing a circuit design from a logic design. The embodiment of FIG. 7 considers entire signal paths at a time, each beginning with a sequential functional block and ending just before the next sequential functional block, as in FIG. 6. Thus after a step 710 of reading the logic design from storage, the system begins a loop 712 through all desired ones of the signal paths in the logic design. This may for example be a nested loop in which the outer loop iterates through all desired sequential blocks as source functional blocks, and the inner loop iterates through all desired sequential blocks (as destination functional blocks) whose inputs are connected combinationally to the output of the current source functional block. The combination of a source and destination functional block defines a signal path to be considered in the body of the loop.

In step 714, the system develops a set of candidate solutions for the current signal path. This step, which may be conventional, tests various combinations of library standard cells for implementing the various functional blocks in the path, rejecting those combinations that fail to satisfy a set of primary criteria such as delay, setup and hold time, transition time, capacitance and/or fan-out. Each candidate solution identifies a library cell for implementing each of the functional blocks in the current path. The various solutions will differ in many parameters, such as delay, setup and hold time, transition time, capacitance, fan-out, total chip area occupied, total leakage, and sensitivity. Note that some candidate solutions can increase delay times not only due to cell selection, but also increased wire lengths. Some candidate solutions also can included added buffers, for example if increased drive strength is needed to meet timing requirements. If buffers are inserted at this stage, however, they are not conventionally required to be placed physically adjacent to the cell output.

In step 716, in an aspect of the invention, the candidate solution set is augmented with variations on the candidates provided by step 714. In step 716, the added candidate solutions can be developed by swapping any or all cells in the signal path, sequential or combinational, with other library cells that perform the same function. In addition, any or cells in a candidate solution can have one or more buffers inserted on its output. Buffers are usually not inserted except for immutably sensitive cells, which as used herein are cells which exhibit high sensitivity but have relatively few or no alternative variants in the library. Typically these cells are complex cells with multiple levels of internal logic, or cells which for one reason or another have been marked "do not modify". When a buffer is inserted, an attempt is made to choose a buffer whose input pin capacitance best matches the driver of the immutably sensitive cell. It is noteworthy that this might not necessarily be the buffer with the lowest input capacitance.

While in some embodiments the additional candidates can be developed by swapping or inserting buffers for more than one cell in an existing candidate solution, it is preferable to first identify the one cell in each candidate solution, referred to herein as the "target" cell, that is most likely to improve a desired operational parameter. The variations created from that candidate solution then all involve swapping only the target cell, and/or inserting buffer(s) on the output of the target cell.

In step 718, the system analyzes the augmented candidate solution set and rejects any candidate solutions that fail to meet the primary criteria from step 714. After step 718, the candidate solution set may contain, for example, on the order of tens of candidates.

In step 720, the system selects a candidate solution in dependence upon, among other things, sensitivity of the solution to changes in output loading conditions. This selection could include explicit rules, such as selecting the least sensitive solution, or selecting the least sensitive solution that also meets other specified criteria. Preferably, however, sensitivity is merely included in a cost function that also takes into account other relative benefits and detriments among the candidates. The cost function quantifies each of the factors it will consider, and combines them in a fashion which weights them according to a predefined set of priorities. In particular, the cost function applied in step 720 is a weighted sum of area, leakage and sensitivity metrics of the candidate solutions. A cost is calculated for each candidate solution, and the one with the lowest (or highest, in some embodiments) cost is selected.

Note that the sensitivity metric used in this cost function is sensitivity of the entire path. However, since in the embodiment of FIG. 7, all the candidate solutions that derived from a given predecessor candidate solution differ in only the one target functional block, the relative sensitivity for those solutions is the same as the relative sensitivity of the specific library cell chosen for the target functional block in those solutions. If a particular candidate solution has a buffer inserted after the cell implementing the target functional block, then the relative sensitivity for that candidate solution is the same as the relative sensitivity of that buffer. The system retrieves these sensitivity metrics from the sensitivity database previously created.

If the selected solution involves inserting a buffer or buffers after the output of a cell, it is desirable that in layout, the buffers be placed physically as close as possible to the cell output. This helps to avoid variability in the load capacitance and resistance experienced by the cell output itself. If the buffer is placed too far away, then the reduced sensitivity achieved by its insertion can be negated. Preferably the buffer is placed directly adjacent to the cell output.

Many integrated circuit layout tools accept constraints from upstream software in the physical placement of particular cells. These constraints, sometimes called annotations, can be specified in the database by which a circuit design is provided to the layout tool for processing. One of these constraints can be that one specified cell be placed physically adjacent to, or as near as possible to, the output of another specified cell. These constraints do not necessarily guarantee physical adjacency. Rather, typically the layout tool includes the constraint with a heavy weighting in a cost function with which it determines where cells are to be placed. In an aspect of the present invention, in step 722, if a selected solution involves inserting a buffer or buffers after the output of a cell, an annotation is stored in conjunction with the selected solution indicating a constraint that the buffer be placed directly adjacent to, or as near as possible to, the cell output.

In step 724, if there are more signal paths to optimize, the system returns to step 712 to develop candidate solutions for the next one. Otherwise, in step 726, the optimized circuit design is written to storage.

Computer System

Figure 8:
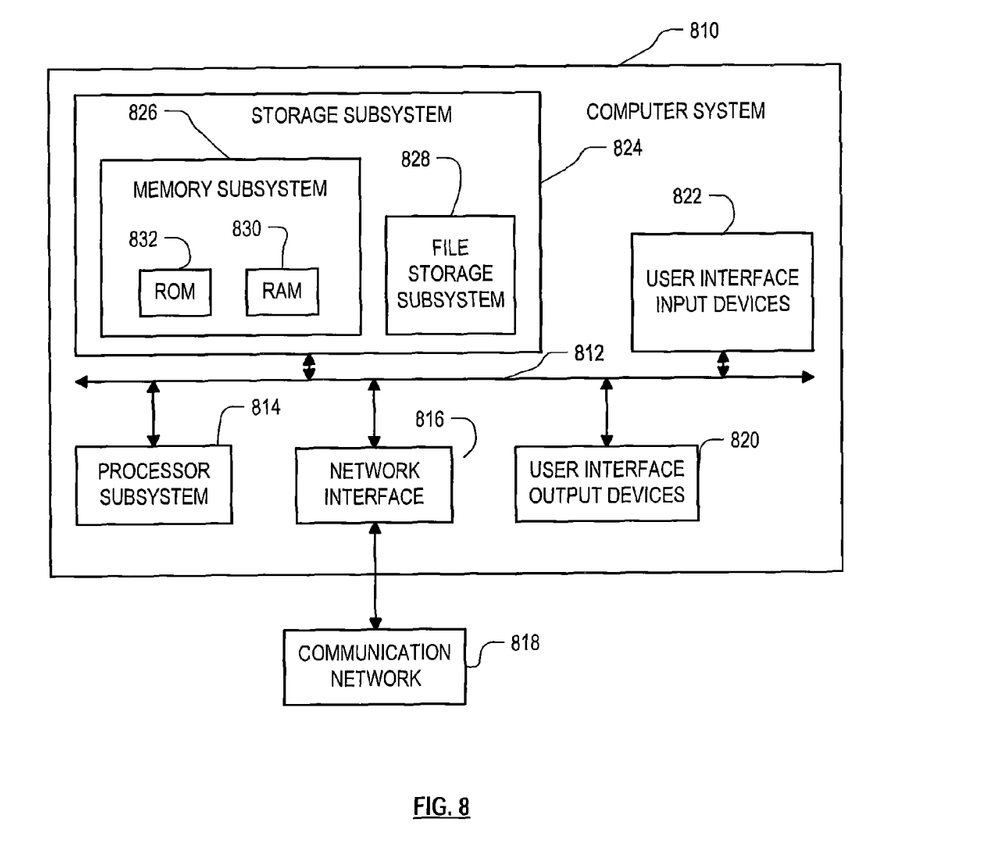
FIG. 8 is a simplified block diagram of a computer system that can be used to implement aspects of the invention.

FIG. 8 is a simplified block diagram of a computer system 810 that can be used to implement software incorporating aspects of the present invention. While FIGS. 4 and 7 indicate individual steps carrying out specified operations, it will be appreciated that each step is actually implemented with software instructions that cause the computer system 810 to operate in the specified manner. The group of software instructions and data to implement a particular step, in conjunction with the processing subsystem and other components of the computer system which enable such software instructions to be executed, constitute a module which implements the particular step.

Computer system 810 typically includes a processor subsystem 814 which communicates with a number of peripheral devices via bus subsystem 812. These peripheral devices may include a storage subsystem 824, comprising a memory subsystem 826 and a file storage subsystem 828, user interface input devices 822, user interface output devices 820, and a network interface subsystem 816. The input and output devices allow user interaction with computer system 810. Network interface subsystem 816 provides an interface to outside networks, including an interface to communication network 818, and is coupled via communication network 818 to corresponding interface devices in other computer systems. Communication network 818 may comprise many interconnected computer systems and communication links. These communication links may be wireline links, optical links, wireless links, or any other mechanisms for communication of information. While in one embodiment, communication network 818 is the Internet, in other embodiments, communication network 818 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 822 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 810 or onto computer network 818.

User interface output devices 820 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 810 to the user or to another machine or computer system.

Storage subsystem 824 stores the basic programming and data constructs that provide the functionality of certain embodiments of the present invention. For example, the various modules implementing the functionality of certain embodiments of the invention may be stored in storage subsystem 824. These software modules are generally executed by processor subsystem 814. Storage subsystem 824 also represents storage accessible to the computer system on which the various databases mentioned herein are stored. In another embodiment some or all of the databases are located on storage accessible to the computer system via the network 818.

Memory subsystem 826 typically includes a number of memories including a main random access memory (RAM) 830 for storage of instructions and data during program execution and a read only memory (ROM) 832 in which fixed instructions are stored. File storage subsystem 828 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 828. The host memory 826 contains, among other things, computer instructions which, when executed by the processor subsystem 814, cause the computer system to operate or perform functions as described herein. As used herein, processes and software that are said to run in or on "the host" or "the computer", execute on the processor subsystem 814 in response to computer instructions and data in the host memory subsystem 826 including any other local or remote storage for such instructions and data.

Bus subsystem 812 provides a mechanism for letting the various components and subsystems of computer system 810 communicate with each other as intended. Although bus subsystem 812 is shown schematically as a single bus, alternative embodiments of the bus subsystem may use multiple busses.

Computer system 810 itself can be of varying types including a personal computer, a portable computer, a workstation, a computer terminal, a network computer, a television, a mainframe, a server farm, or any other data processing system or user device. Due to the ever changing nature of computers and networks, the description of computer system 810 depicted in FIG. 8 is intended only as a specific example for purposes of illustrating certain embodiments of the present invention. Many other configurations of computer system 810 are possible having more or less components than the computer system depicted in FIG. 8.

As used herein, the "identification" of an item of information does not necessarily require the direct specification of that item of information. Information can be "identified" by referring to the actual information through one or more layers of indirection, or by identifying one or more items of different information which are together sufficient to determine the actual item of information. In addition, the term "indicate" is used herein to mean the same as "identify".

Also as used herein, a given value is "responsive" to a predecessor value if the predecessor value influenced the given value. If there is an intervening processing step, the given value can still be "responsive" to the predecessor value. If the intervening processing step combines more than one value, the output of the processing step is considered "responsive" to each of the value inputs. If the given value is the same as the predecessor value, this is merely a degenerate case in which the given value is still considered to be "responsive" to the predecessor value. "Dependency" of a given value upon another value is defined similarly.

The applicants hereby disclose in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicants indicate that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas the loading conditions referenced in the embodiments herein are the capacitance of the next downstream cell input, it will be understood that in a different embodiment loading conditions can also include other factors such as load resistance, as well as characteristics of the interconnection conductors.

In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A system for synthesizing a circuit design from a logic design, for use in developing and fabricating integrated circuit devices which implement the functions of the logic design, for use by a computer system having a processor and accessible storage, the logic design specifying functional blocks having inputs and outputs and signal paths from functional block outputs to functional block inputs, each signal path including a source functional block and optionally one or more signal path functional blocks downstream of the source functional block but upstream of a destination functional block, the signal paths including a particular path from a particular source functional block to a particular destination functional block, the system comprising:

a memory;

a data processor coupled to the memory;

a module which develops a candidate set identifying a plurality of candidate solutions for the particular path, each of the solutions identifying a library cell implementing a particular one of the functional blocks in the particular path, a first one of the candidate solutions identifying, for implementing the particular functional block, a first one of the library cells followed immediately downstream thereof by a first set of zero or more buffers, and a second one of the candidate solutions identifying, for implementing the particular functional block, a second one of the library cells followed immediately downstream thereof by a second set of zero or more buffers, the first library cell and first set of buffers in combination being different from the second library cell and second set of buffers in combination, each candidate solution in the candidate set having associated therewith a sensitivity value indicating the amount by which an operational parameter of the candidate solution varies in response to a change in load capacitance in the particular path;

a module which selects among the candidate solutions in dependence upon their respective sensitivity values; and a module which stores the selected solution in the storage for subsequent use in further developing and fabricating an integrated circuit device.

2. The system according to claim 1, wherein the particular functional block is the particular source functional block.

3. The system according to claim 1, wherein the particular functional block is a signal path functional block.

4. The system according to claim 3, wherein the first and second candidate solutions also identify different library cells for implementing an additional functional block of the particular path.

5. The system according to claim 1, wherein the first and second library cells are different.

6. The system according to claim 1, wherein the first set of buffers in combination is different from the second set of buffers in combination.

7. The system according to claim 6, wherein the first set of buffers has zero buffers and the second set of buffers has at least one buffer.

8. The system according to claim 1, wherein the selection among the candidate solutions selects the first candidate solution,
wherein the first set of buffers includes at least one buffer,
and wherein the module which stores the selected solution also stores a constraint that the at least one buffer be placed adjacent to the library cell implementing the particular functional block.

9. The system according to claim 1, wherein at least one of the first and second sets of buffers includes at least one buffer,
and wherein the selection among the candidate solutions in dependence upon their respective sensitivity values, includes comparing a predetermined sensitivity value to variations in input capacitance of the next cell downstream of the particular functional block, of the first library cell and first set of buffers in combination, with that of the second library cell and second set of buffers in combination.

10. The system according to claim 1, wherein the selection among the candidate solutions in dependence upon their respective sensitivity values, comprises comparing a predetermined sensitivity value of the first library cell to variations in input capacitance of a next cell downstream of the particular functional block, with a predetermined sensitivity value of the second library cell to variations in input capacitance of the next cell downstream of the particular functional block.

11. The system according to claim 1, wherein the module which selects among the candidate solutions in dependence upon their respective sensitivity values includes the sensitivity values in a cost function for comparing the candidate solutions.

12. A method for synthesizing a circuit design from a logic design, for use in developing and fabricating integrated circuit devices which implement the functions of the logic design, for use by a computer system having a processor and accessible storage, the logic design specifying functional blocks having inputs and outputs and signal paths from functional block outputs to functional block inputs, each signal path including a source functional block and optionally one or more signal path functional blocks downstream of the source functional block but upstream of a destination functional block, the signal paths including a particular path from a particular source functional block to a particular destination functional block, comprising the steps of:
developing a candidate set identifying a plurality of candidate solutions for the particular path, each of the solutions identifying a library cell implementing a particular one of the functional blocks in the particular path, a first one of the candidate solutions identifying, for implementing the particular functional block, a first one of the library cells followed immediately downstream thereof by a first set of zero or more buffers, and a second one of the candidate solutions identifying, for implementing the particular functional block, a second one of the library cells followed immediately downstream thereof by a second set of zero or more buffers, the first library cell and first set of buffers in combination being different from the second library cell and second set of buffers in combination, each candidate solution in the candidate set having associated therewith a sensitivity value indicating the amount by which an operational parameter of the candidate solution varies in response to a change in load capacitance in the particular path;
the computer system selecting among the candidate solutions in dependence upon their respective sensitivity values; and
storing the selected solution in the storage for subsequent use in further developing and fabricating an integrated circuit device.

13. The method according to claim 12, wherein the step of selecting among the candidate solutions selects the first candidate solution,
wherein the first set of buffers includes at least one buffer,
and wherein the step of storing the selected solution includes a step of storing a constraint that the at least one buffer be placed adjacent to the library cell implementing the particular functional block.

14. The method according to claim 12, wherein at least one of the first and second sets of buffers includes at least one buffer,
and wherein the step of selecting among the candidate solutions in dependence upon their respective sensitivity values, comprises comparing a predetermined sensitivity value to variations in input capacitance of the next cell downstream of the particular functional block, of the first library cell and first set of buffers in combination, with that of the second library cell and second set of buffers in combination.

15. The method according to claim 12, wherein the step of selecting among the candidate solutions in dependence upon their respective sensitivity values, comprises comparing a predetermined sensitivity value of the first library cell to variations in input capacitance of a next cell downstream of the particular functional block, with a predetermined sensitivity of the second library cell to variations in input capacitance of the next cell downstream of the particular functional block.

16. The method according to claim 12, wherein the step of selecting among the candidate solutions in dependence upon their respective sensitivity values comprises a step of including the sensitivity values in a cost function for comparing the candidate solutions.

17. A system for synthesizing a circuit design from a logic design, for use in developing and fabricating integrated circuit devices which implement the functions of the logic design, for use by a computer system having access to a standard cell library, the standard cell library including an indication of cell delay, for each of a plurality of cells in the cell library and for a particular loading condition of the respective cell, the system comprising:
a memory;
a data processor coupled to the memory;

a module which determines the cell delay, for each cell in the plurality of cells, for a loading condition of the cell which differs from the particular loading condition of the respective cell;

a module which determines a cell sensitivity value for each cell in the plurality of cells, the sensitivity value indicating a difference between the cell delay for the cell at the particular loading condition and the cell delay for the cell at the loading condition which differs from the particular loading condition of the respective cell; and a module which stores, for each given one of the cells in the plurality of cells, an identification of the given cell in coordination with an identification of the sensitivity value of the given cell.

18. The system according to claim 17, wherein the standard cell library further includes an indication of cell transition time, for each of a plurality of cells in the cell library and for the particular loading condition of the respective cell, the system further comprising:

a module which determines the cell transition time, for each cell in the plurality of cells, for the loading condition of the cell which differs from the particular loading condition of the respective cell; and a module which determines a cell further sensitivity value for each cell in the plurality of cells, the further sensitivity value indicating a difference between the cell transition time for the cell at the particular loading condition and the cell transition time for the cell at the loading condition which differs from the particular loading condition of the respective cell, and wherein the storing module further stores, for each given one of the cells in the plurality of cells, in coordination with the identification of the given cell, an identification of the further sensitivity value of the given cell.

19. A method for synthesizing a circuit design from a logic design, for use in developing and fabricating integrated circuit devices which implement the functions of the logic design, for use by a computer system having access to a standard cell library, the standard cell library including an indication of cell delay, for each of a plurality of cells in the cell library and for a particular loading condition of the respective cell, comprising the steps of:

a computer system determining the cell delay, for each cell in the plurality of cells, for a loading condition of the cell which differs from the particular loading condition of the respective cell;

a computer system determining a cell sensitivity value for each cell in the plurality of cells, the sensitivity value indicating a difference between the cell delay for the cell at the particular loading condition and the cell delay for the cell at the loading condition which differs from the particular loading condition of the respective cell; and a computer system storing, for each given one of the cells in the plurality of cells, an identification of the given cell in coordination with an identification of the sensitivity value of the given cell.

20. The method according to claim 19, wherein the standard cell library further includes an indication of cell transition time, for each of a plurality of cells in the cell library and for the particular loading condition of the respective cell, further comprising the steps of:

a computer system determining the cell transition time, for each cell in the plurality of cells, for the loading condition of the cell which differs from the particular loading condition of the respective cell;

a computer system determining a cell further sensitivity value for each cell in the plurality of cells, the further sensitivity value indicating a difference between the cell transition time for the cell at the particular loading condition and the cell transition time for the cell at the loading condition which differs from the particular loading condition of the respective cell; and a computer system storing, for each given one of the cells in the plurality of cells, in coordination with the identification of the given cell, an identification of the further sensitivity value of the given cell.

\* \* \* \* \*